United States Patent
Yang et al.

(10) Patent No.: US 6,541,323 B2
(45) Date of Patent: Apr. 1, 2003

(54) METHOD FOR FABRICATING POLYSILICON THIN FILM TRANSISTOR

(75) Inventors: Joon Young Yang, Gyeonggi-do (KR); Jae Beom Choi, Gyeonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/966,749

(22) Filed: Oct. 1, 2001

(65) Prior Publication Data

US 2002/0102781 A1 Aug. 1, 2002

(30) Foreign Application Priority Data

Oct. 6, 2000 (KR) .................................... 2000-0058678

(51) Int. Cl.$^7$ .......................................... H01L 21/8238
(52) U.S. Cl. ...................... 438/200; 438/158; 438/162; 438/166
(58) Field of Search ................. 438/200, 149, 438/158, 161, 162, 166, 486, 164, 412, 766

(56) References Cited

U.S. PATENT DOCUMENTS 5,825,050 A * 10/1998 Hirakawa .................. 257/57
6,218,219 B1 * 4/2001 Yamazaki et al. ........... 438/149

FOREIGN PATENT DOCUMENTS

| JP | 05-203988 | 8/1993 |
|----|-----------|--------|
| KR | 10-0322655 | 1/2002 |

* cited by examiner

Primary Examiner—Phat X. Cao
Assistant Examiner—Theresa T. Doan
(74) Attorney, Agent, or Firm—Morgan, Lewis & Bockius LLP

(57) ABSTRACT

A method of fabricating a polysilicon thin film transistor on a substrate includes forming a gate electrode on the substrate, forming a gate insulating layer on the gate electrode including the substrate, sequentially forming an intrinsic amorphous silicon layer and a doped amorphous silicon layer on the gate insulating layer, forming a catalytic metal layer on the doped amorphous silicon layer by an ion doping method, simultaneously crystallizing the doped amorphous silicon layer and the intrinsic amorphous silicon layer so as to form a doped polysilicon layer and an intrinsic polysilicon layer, respectively, forming a source electrode and a drain electrode on the doped polysilicon layer, and removing a portion of the doped polysilicon layer between the source and drain electrodes.

8 Claims, 4 Drawing Sheets

METHOD FOR FABRICATING POLYSILICON THIN FILM TRANSISTOR

This application claims the benefit of Korean Application No. P2000-58678 filed on Oct. 6, 2000, which is hereby incorporated by reference.

BACKGROUND OF THE INVENTION

1. Field of the Invention

The present invention relates to a thin film transistor (TFT), and more particularly, to a method for fabricating a polysilicon TFT. Although the present invention is suitable for a wide scope of applications, it is particularly suitable for improving electrical characteristics of the thin film transistor.

2. Discussion of the Related Art

In a conventional process for forming a polysilicon layer, an intrinsic amorphous silicon layer is formed on an insulating substrate by using a plasma chemical vapor deposition (PCVD) method or a low pressure chemical vapor deposition (LPCVD) method. After the amorphous silicon layer has a thickness of about 500 Å (angstrom), it is recrystallized into a polysilicon layer by using a crystallization method. The crystallization method is generally classified into a laser annealing method, a solid phase crystallization (SPC) method, and a metal induced crystallization (MIC) method.

For the laser annealing method, an insulating substrate where an amorphous silicon layer is formed is heated to a temperature of about 250° C. An eximer laser beam then is applied to the amorphous silicon layer to form a polysilicon layer. For the SPC method, a heat-treatment is used to the amorphous silicon layer at a high temperature for a long time to form a polysilicon layer. For the MIC method, a metal layer is deposited on the amorphous silicon layer and the deposited metal is used for a crystallization seed. In case of the MIC method, a large scaled glass substrate can be used as an insulating substrate.

The laser annealing method has been widely used to form a polysilicon layer. In the laser annealing method, laser energy is provided for the amorphous silicon layer formed on the insulating substrate, thereby melting the amorphous silicon layer. Then, the melted amorphous silicon is transformed to polysilicon by a cooling process.

In case of the SPC method, a buffer layer is formed on a quartz substrate that can stand at a temperature higher than 600° C. The buffer layer serves to prevent spreading a contamination from the quartz substrate. Thereafter, an amorphous silicon layer is deposited on the buffer layer and is sufficiently heat-treated in a furnace at a high temperature so as to form a polysilicon layer. However, because the SPC method is performed at the high temperature, it is difficult to acquire a desired polysilicon phase.

In the process of SPC method, because polysilicon grains develop without a continuous directionability, the polysilicon layer may have an irregular surface. For a thin film transistor, a gate insulating layer covers the polysilicon layer. Therefore, if the polysilicon layer has the irregular surface, the gate insulating layer is also irregularly formed, thereby decreasing a breakdown voltage of the thin film transistor. In addition, size of the polysilicon grains formed by the SPC method is very irregular, thereby deteriorating electrical characteristics of a device adopting the polysilicon layer. Furthermore, the quartz substrate used for the SPC method is very expensive, thereby increasing a fabrication cost.

Unlike the SPC method that uses an expensive quartz substrate, the MIC method uses a relatively cheap glass substrate to form polysilicon. In case of using the MIC method, however, metal impurities may remain in the polysilicon network, thereby deteriorating the quality of the polysilicon layer. Accordingly, new methods have been developed to improve the MIC method.

A field effect metal induced crystallization (FEMIC) method is an example of the improved MIC method. In the FEMIC method, after a metal layer is deposited on a substrate, a high density direct current is applied to the metal layer to cause Joule heating. Because of the heated metal, an amorphous silicon formed on the heated substrate is crystallized into the polysilicon. At this point, the metal serves as a catalyzer and is referred as a catalytic metal.

FIGS. 1A to 1F illustrate a typical process of forming a polysilicon TFT according to the related art. The polysilicon TFT is a coplanar type TFT having a top gate structure. The FEMIC method is applied to form the polysilicon TFT.

In FIG. 1A, a first insulating layer 2 and an amorphous silicon layer 4 are sequentially deposited on a substrate 1. The first insulating layer 2 is to protect the amorphous silicon layer 4 from alkali substances, which may be produced from the substrate 1 in later processes. After the amorphous silicon layer 2 is formed, a thin catalytic metal layer 5 is formed thereon. Nickel (Ni) is typically selected for the catalytic metal.

In FIG. 1B, a power source 6 applies a high density current to the catalytic metal layer 5, thereby crystallizing the amorphous silicon layer 4 (shown in FIG. 1A) into a polysilicon layer 7. After the crystallization process, the catalytic metal layer 5 is removed from the substrate 1, and the polysilicon layer 7 is patterned into a polysilicon island 8, as shown in FIG. 1C.

In FIG. 1D, a second insulating layer 10 referred to as a gate insulating layer and a gate electrode 12 are sequentially formed on the polysilicon island 8. Then, an ion doping is applied to the polysilicon island 8, thereby dividing the polysilicon layer 8 into an active region 14, a source region 16, and a drain region 17. The active region 14 is a pure silicon region, whereas the source and drain regions 16 and 17 are doped silicon regions. The active region 14 is centered between the source and drain regions 16 and 17 on the first insulating layer 2, and the gate insulating layer 10 and the gate electrode 12 are disposed on the active region 14.

Because the gate insulating layer 10 and the gate electrode 12 are patterned with the same mask in order to reduce the number of masks, they have the same shape. When the ion doping is applied to the polysilicon island 8, the gate electrode 12 serves as an ion stopper to prevent a dopant from penetrating into the active region 14. After the ion doping is finished, the polysilicon island 8 implements a specific electric characteristic, which varies with types of the dopant. If the dopant includes a Group III element such as $B_2H_6$ that, the doped portion of the polysilicon island 8 becomes a p-type semiconductor. If the dopant includes a Group VI element such as $PH_3$, the doped portion of the polysilicon island 8 becomes an n-type semiconductor. A proper dopant should be selected to satisfy the use of a device. After the dopant is applied onto the polysilicon island 8, the dopant is activated.

In FIG. 1E, a third insulating layer 18 that serves as an interlayer insulating layer is formed to cover the gate electrode 12, the active region 14, and the source and drain regions 16 and 17. A source contact hole 18a and a drain contact hole 18b are formed to pass through the third insulating layer 18, thereby exposing the source and drain regions 16 and 17, respectively.

In FIG. 1F, a source electrode 20 and a drain electrode 22 are formed on the third insulating layer 18. The source and drain electrodes 20 and 22 electrically contact the source and drain regions 16 and 17, respectively, through the source and drain contact holes 18a and 18b. Thereafter, a passivation layer 26 and a pixel electrode 28 are sequentially formed to cover the source and drain electrodes 20 and 22. The passivation layer 26 has a pixel contact hole 26a that exposes a portion of the drain electrode 22. The pixel electrode 28 electrically contacts the drain elelctrode 22 through the pixel contact hole 26a.

In the conventional process of fabricating the polysilicon TFT, it is difficult for the catalytic metal layer 5 (shown in FIG. 1A) to have a uniform thickness. If the catalytic metal layer 5 has an irregular thickness, the amorphous silicon layer 5 cannot be uniformly crystallized, thereby deteriorating electrical characteristics of the active layer 14 (shown in FIG. 1D).

SUMMARY OF THE INVENTION

Accordingly, the present invention is directed to a method for fabricating a polysilicon thin film transistor that substantially obviates one or more of problems due to limitations and disadvantages of the related art.

Another object of the present invention is to provide a method for fabricating a polysilicon thin film transistor having reliable electrical characteristics.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a polysilicon thin film transistor on a substrate includes forming a gate electrode on the substrate, forming a gate insulating layer on the gate electrode including the substrate, sequentially forming an intrinsic amorphous silicon layer and a doped amorphous silicon layer on the gate insulating layer, forming a catalytic metal layer on the doped amorphous silicon layer by an ion doping method, simultaneously crystallizing the doped amorphous silicon layer and the intrinsic amorphous silicon layer so as to form a doped polysilicon layer and an intrinsic polysilicon layer, respectively, forming a source electrode and a drain electrode on the doped polysilicon layer, and removing a portion of the doped polysilicon layer between the source and drain electrodes.

The insulating layer is selected from a group consisting of silicon oxide ($SiO_2$), silicon nitride ($SiN_X$), and tetra ethoxy silane (TEOS).

The doped amorphous silicon layer is an n-type semiconductor formed by doping a $PH_3$ gas to the intrinsic amorphous silicon layer, or the doped amorphous silicon layer is a p-type semiconductor formed by doping a $B_2H_6$ gas to the intrinsic amorphous silicon layer.

The catalytic metal layer is selected from a group consisting of nickel (Ni), lead (Pb), and cobalt (Co).

A direct current is applied to the catalytic metal layer to crystallize the intrinsic amorphous silicon layer and the doped amorphous silicon layer.

The method further includes simultaneously patterning the doped polysilicon layer and the intrinsic polysilicon layer to form a polysilicon island disposed over the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

In the present invention, deposition rate of a catalytic metal layer is uniformly controlled when a metal induced crystallization (MIC) method or a field effect metal induced crystallization (FEMIC) method is used to form a polysilicon layer of a polysilicon TFT. FIGS. 2A to 2E shows a process of forming the polysilicon TFT according to the present invention.

Figure 1A:
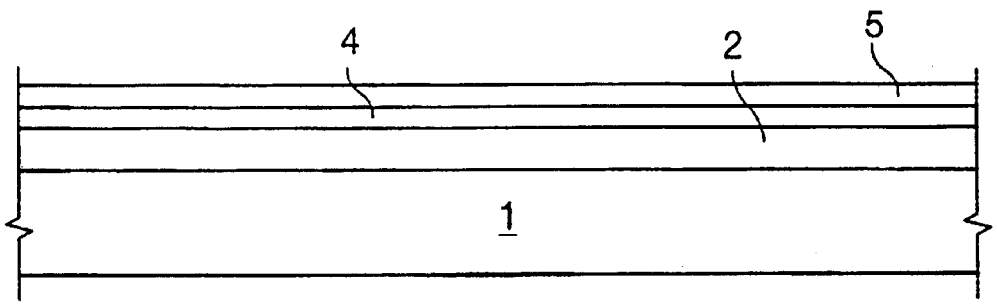
FIGS. 1A to 1F are cross-sectional views illustrating a sequence of fabricating a polysilicon TFT according to the related art.
Figure 1B:
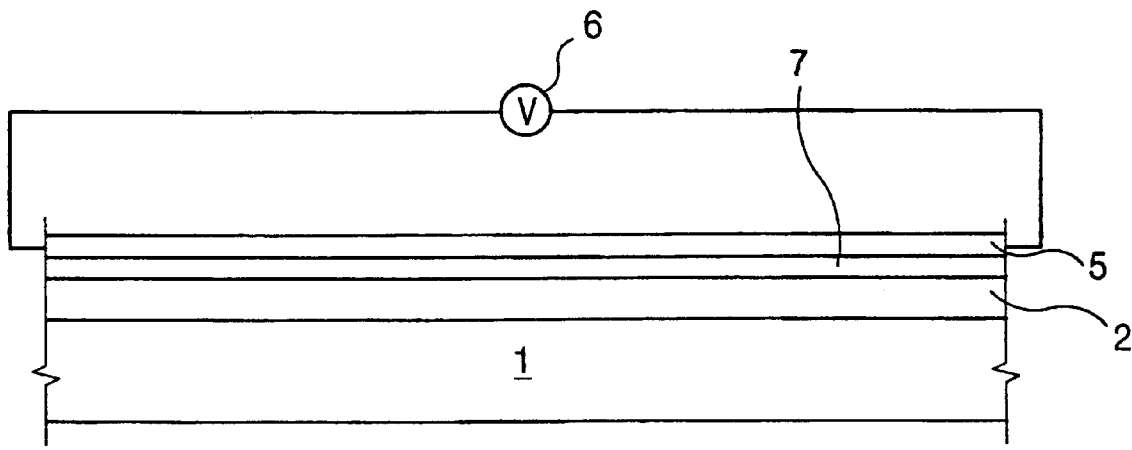
Figure 1C:
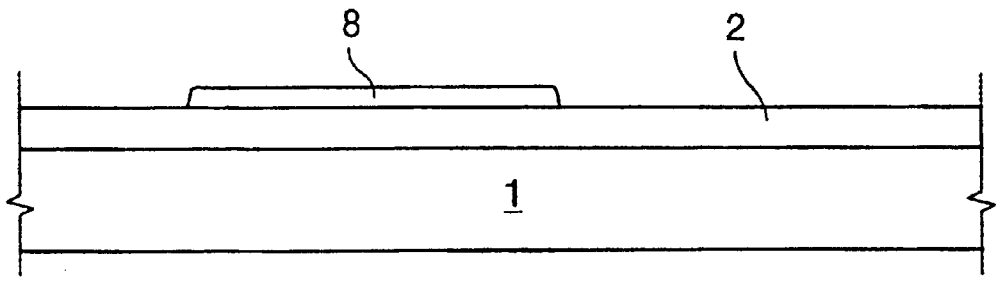
Figure 1D:
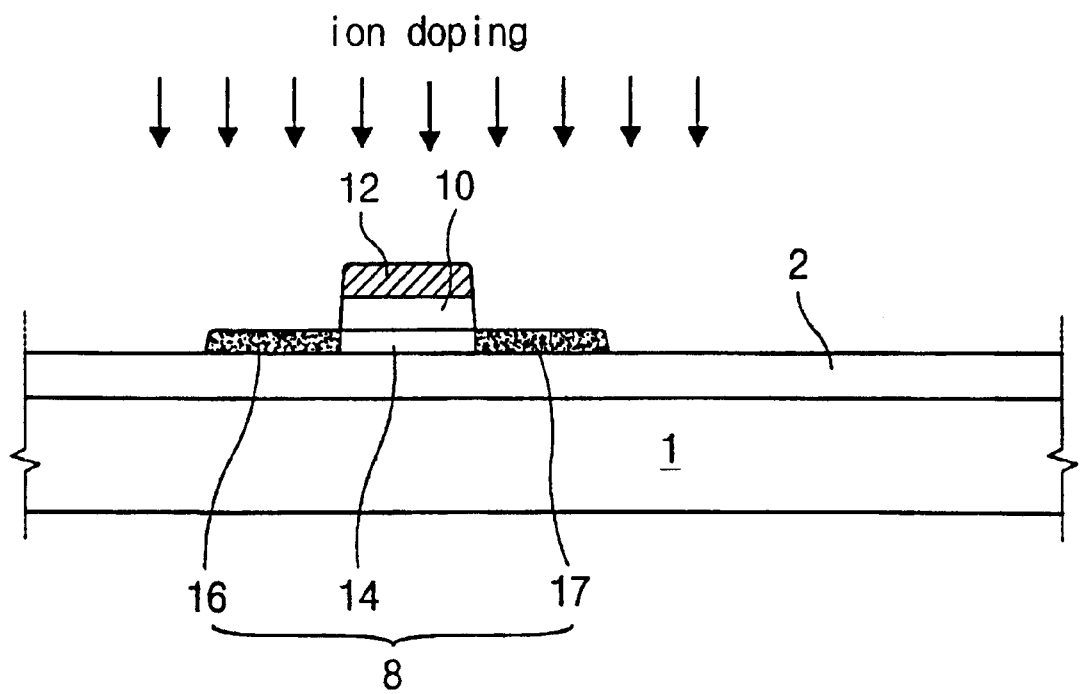
Figure 1E:
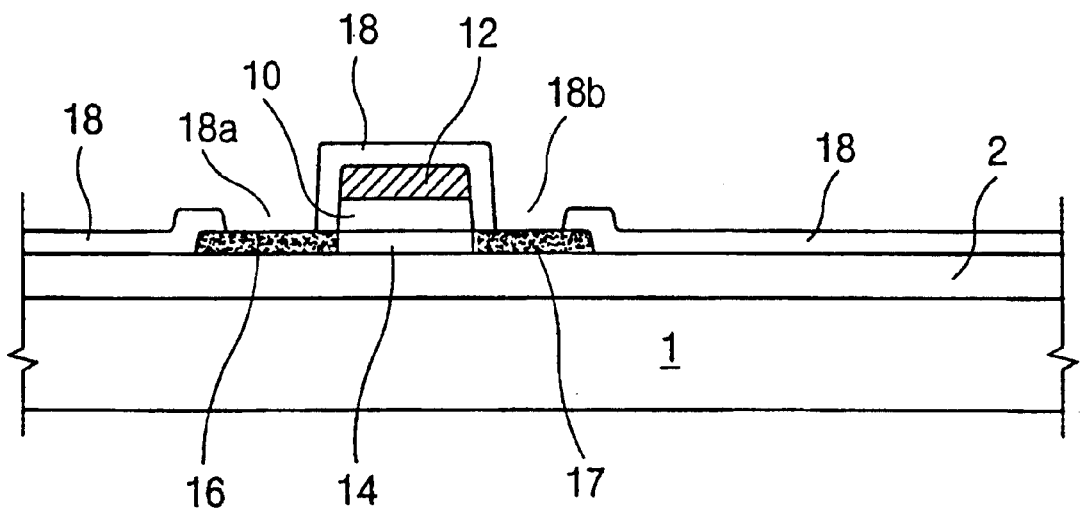
Figure 1F:
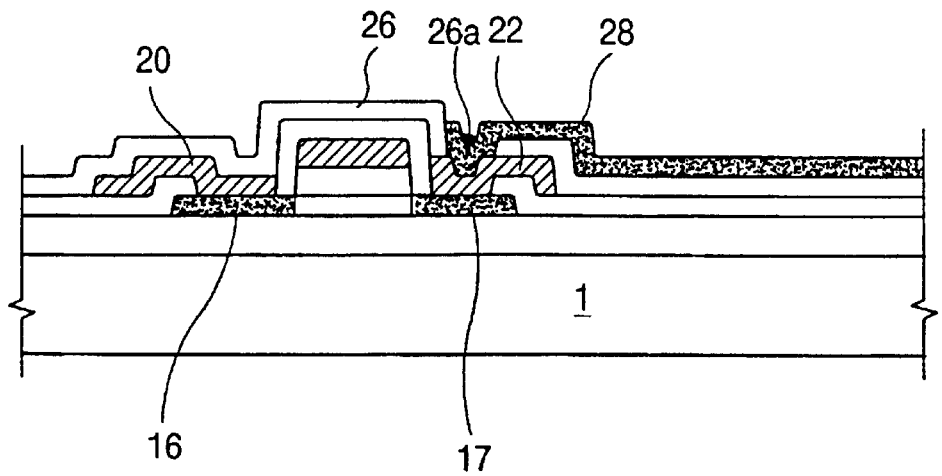
Figure 2A:
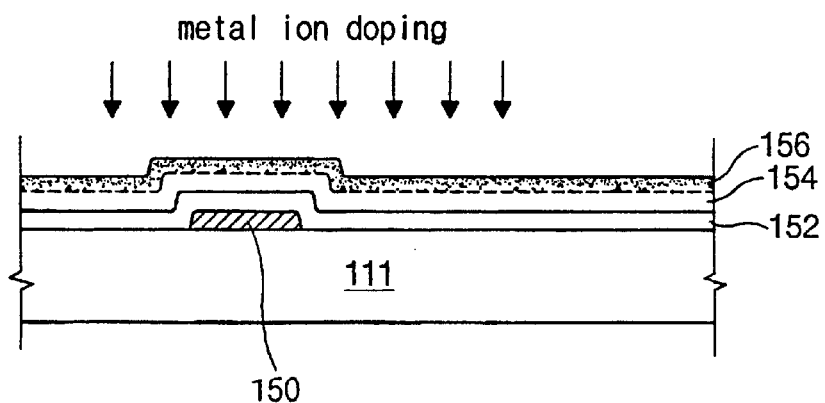
FIGS. 2A to 2E are cross-sectional views illustrating a sequence of fabricating a polysilicon TFT according to the present invention.

In FIG. 2A, an insulating layer 152, an intrinsic amorphous silicon layer 154, and a doped amorphous silicon layer 156 are sequentially formed on a substrate 111 after a gate electrode 150 is formed on the substrate 111. The insulating layer 152 may be selected from one of silicon oxide ($SiO_2$), silicon nitride ($SiN_X$), and tetra ethoxy silane (TEOS), for example. The doped amorphous silicon layer 156 may be formed from the intrinsic amorphous silicon layer 154 by doping n or p-type impurities.

Thereafter, a catalytic metal layer 157 (shown in FIG. 2B) is formed on the doped amorphous silicon layer 156 by an ion doping. When a high density current is applied to the catalytic metal layer 157, Joule heating is caused such that the catalytic metal layer 157 serves as a catalyzer to crystallize the doped amorphous silicon layer 156 and the intrinsic amorphous silicon layer 154. The applied current is high enough to generate a necessary heating. For example, a direct current in the range of about 10 to 500 V/cm may be applied thereon. For example, the catalytic metal layer 157 may be selected from one of nickel (Ni), lead (Pb), and cobalt (Co).

As previously mentioned, the catalytic metal layer 157 is formed by the ion doping. Unlike the conventional method, the catalytic metal layer 157 is not formed by a deposition nor a spray each using a sputter, an evaporator, or a metal solution. In the conventional method of forming the polysilicon TFT, because the deposition or spray is used to form the catalytic metal layer, a thickness of the catalytic metal layer cannot be readily controlled and an additional process for etching the catalytic metal layer should be required. Further, a uniform catalytic metal layer having a uniform thickness is difficult to achieve using the conventional deposition or spray method. If the catalytic metal layer has an irregular thickness, the crystallized polysilicon layer cannot be uniformly crystallized. This is due to a variation in the Joule heating caused by a variation in thickness of the catalytic metal layer. Unlike the deposition or spray, the ion doping is relatively easy to control an intensity and a thickness of the catalytic metal layer.

Figure 2B:
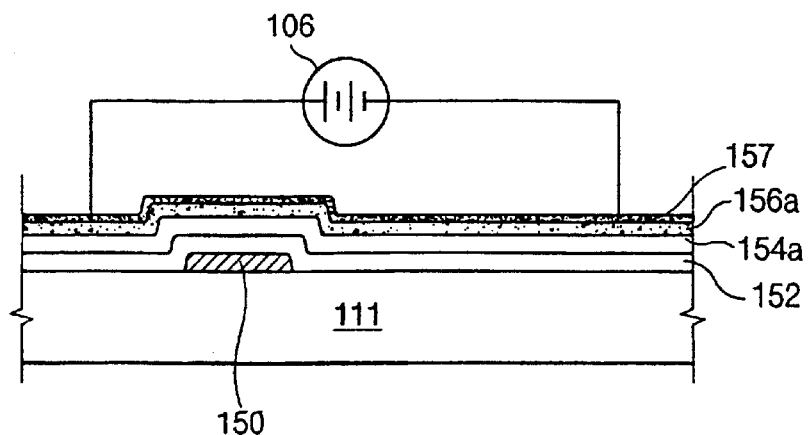

FIG. 2B shows a step of crystallizing the intrinsic amorphous silicon layer 154 and the doped amorphous silicon layer 156. When a power source 106 applies a high density direct current to the catalytic metal layer 157, the Joule heating is generated such that a temperature high enough for crystallization is achieved. Accordingly, the intrinsic amorphous silicon layer 154 and the doped amorphous silicon layer 156 are crystallized into an intrinsic polysilicon layer 154a and a doped polysilicon layer 156a, respectively.

Figure 2C:
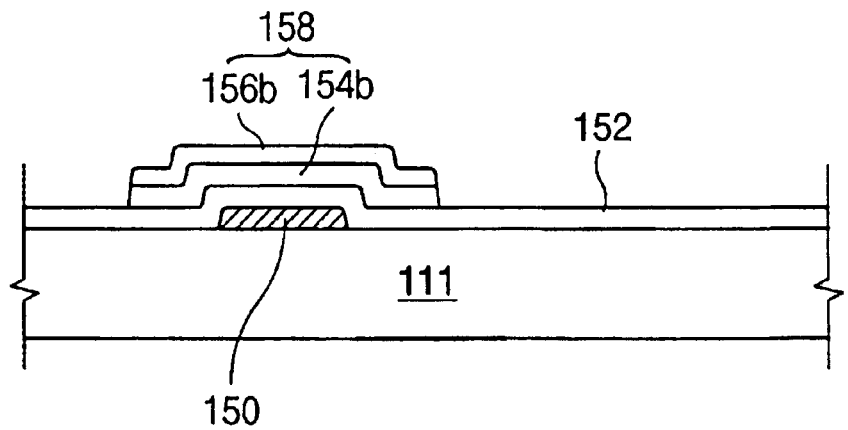

In FIG. 2C, the intrinsic polysilicon layer 154a (shown in FIG. 2B) and the doped polysilicon layer 156a (shown in FIG. 2B) are simultaneously patterned, so that a polysilicon island 158 covering the gate electrode 150 is formed thereon. The polysilicon island 158 includes a doped polysilicon island 156b and an intrinsic polysilicon island 154b.

Figure 2D:
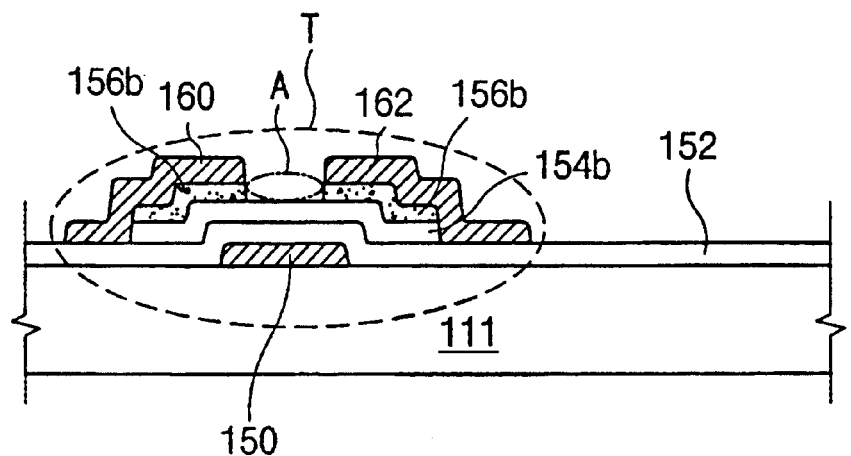

In FIG. 2D, a source electrode 160 and a drain electrode 162 are formed on the doped polysilicon island 156b. Thereafter, a portion "A" of the doped polysilicon island 156b between the source and drain electrodes 160 and 162 is removed. Thus, a leakage current between the source and drain electrodes 160 and 162 is reduced. The source and drain electrodes 160 and 162 are used as a mask in removing the portion "A" of the doped polysilicon island 156b. A polysilicon TFT "T" having the above-described structure is referred to as a back channel etch type polysilicon TFT.

Figure 2E:
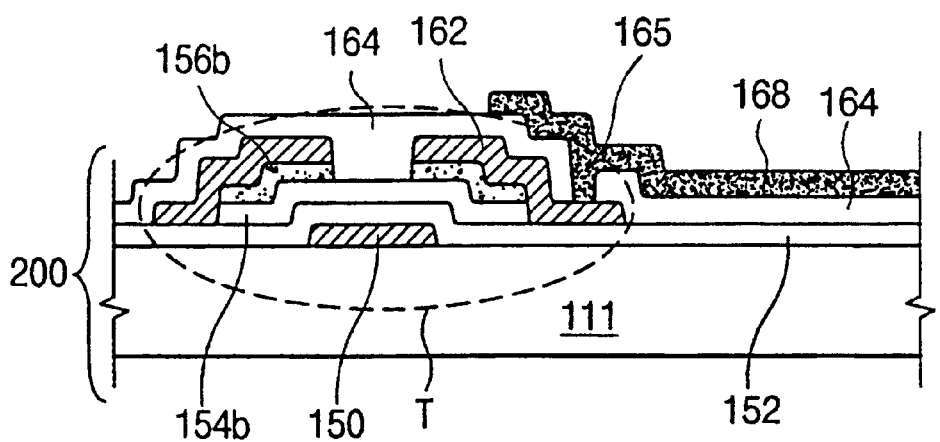

FIG. 2E shows an array substrate 200 of a liquid crystal display device adopting the polysilicon TFT "T" according to the present invention. After the polysilicon TFT "T" is completed in FIG. 2D, a passivation layer 164 is formed to cover the TFT "T". The passivation layer 164 has a contact hole 165 that exposes a portion of the drain electrode 162. Thereafter, a pixel electrode 168 is formed on the passivation layer 164. The pixel electrode 168 electrically contacts the drain electrode 162 through the contact hole 165.

In the above-described method for fabricating the polysilicon TFT according to the present invention, because the doped polysilicon layer and the intrinsic polysilicon layer are simultaneously crystallized, a process time decreases and a fabrication process is simplified. Further, because the catalytic metal layer is formed by applying the ion doping instead of the deposition or spray, an intensity and a thickness of the catalytic metal layer are properly controlled such that the polysilicon layer has a uniform crystallization characteristic.

It will be apparent to those skilled in the art that various modifications and variations can be made in the method for fabricating a polysilicon thin film transistor of the present invention without departing from the spirit or scope of the inventions. Thus, it is intended that the present invention covers the modifications and variations of this invention provided they come within the scope of the appended claims and their equivalents.

What is claimed is:

1. A method for fabricating a thin film transistor on a substrate, the method comprising:

forming a gate electrode on the substrate;

forming a gate insulating layer on the gate electrode including the substrate;

sequentially forming an intrinsic amorphous silicon layer and a doped amorphous silicon layer on the gate insulating layer;

forming a catalytic metal layer on the doped amorphous silicon layer by an ion doping method;

simultaneously crystallizing the doped amorphous silicon layer and the intrinsic amorphous silicon layer so as to form a doped polysilicon layer and an intrinsic polysilicon layer, respectively;

forming a source electrode and a drain electrode on the doped polysilicon layer; and removing a portion of the doped polysilicon layer between the source and drain electrodes.

2. The method of claim 1, wherein the gate insulating layer is selected from a group consisting of silicon oxide ($SiO_2$), silicon nitride ($SiN_x$), and tetra ethoxy silane (TEOS).

3. The method of claim 1, wherein the doped amorphous silicon layer is an n-type semiconductor formed by doping a $PH_3$ gas to the intrinsic amorphous silicon layer.

4. The method of claim 1, wherein the doped amorphous silicon layer is a p-type semiconductor formed by doping a $B_2H_6$ gas to the intrinsic amorphous silicon layer.

5. The method of claim 1, wherein the catalytic metal layer is selected from a group consisting of nickel (Ni), lead (Pb), and cobalt (Co).

6. The method of claim 1, wherein the catalytic metal layer is applied by a current high enough to crystallize the intrinsic amorphous silicon layer and the doped amorphous silicon layer.

7. The method of claim 6, wherein the current is in the range of about 10 to 500 V/cm.

8. The method of claim 1, further comprising simultaneously patterning the doped polysilicon layer and the intrinsic polysilicon layer to form a polysilicon island disposed over the gate electrode after simultaneously crystallizing the doped amorphous silicon layer and the intrinsic amorphous silicon layer.

* * * * *